(12) United States Patent
Joo et al.

(10) Patent No.: US 10,217,950 B2
(45) Date of Patent: Feb. 26, 2019

(54) STRETCHABLE FILMS, METHODS OF MANUFACTURING THE SAME AND DISPLAY DEVICES INCLUDING THE SAME

(71) Applicant: Samsung Display Co., Ltd., Yongin (KR)

(72) Inventors: Hye-Jin Joo, Suwon-si (KR); Won-Il Choi, Ansan-si (KR); Jong-Ho Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 615 days.

(21) Appl. No.: 14/809,886

(22) Filed: Jul. 27, 2015

(65) Prior Publication Data
US 2016/0104850 A1    Apr. 14, 2016

(30) Foreign Application Priority Data
Oct. 8, 2014 (KR) .................. 10-2014-0135628

(51) Int. Cl.
*H01L 27/32* (2006.01)
*H01L 51/00* (2006.01)
(Continued)

(52) U.S. Cl.
CPC .......... *H01L 51/0097* (2013.01); *B32B 1/00* (2013.01); *B32B 3/266* (2013.01); *B32B 5/14* (2013.01); *B32B 5/142* (2013.01); *B32B 5/145* (2013.01); *B32B 5/147* (2013.01); *B32B 7/02* (2013.01); *B32B 27/283* (2013.01); *B32B 27/40* (2013.01); *G02F 1/133308* (2013.01); *G03F 7/20* (2013.01); *G09G 3/006* (2013.01); *H01L 27/3234* (2013.01); *H01L 27/3244* (2013.01); *B32B 2307/50* (2013.01);
(Continued)

(58) Field of Classification Search
CPC ............. H01L 27/3234; H01L 27/3244; H01L 51/0097
See application file for complete search history.

(56) References Cited

U.S. PATENT DOCUMENTS

| | | |
|---|---|---|
| 2001/0035256 A1 | 11/2001 | Hall et al. |
| 2007/0122590 A1 | 5/2007 | Lalvani |

(Continued)

FOREIGN PATENT DOCUMENTS

| | | |
|---|---|---|
| EP | 2341566 | 6/2011 |
| JP | 2007-159603 | 6/2007 |

(Continued)

OTHER PUBLICATIONS

Fozdar, et al. Three-Dimensional Polymer Constructs Exhibiting a Tunable Negative Poisson's Ratio. Advanced Functional Materials, May 11, 2011, 21, 2712-2720.
(Continued)

*Primary Examiner* — Joseph Galvin, III
(74) *Attorney, Agent, or Firm* — H.C. Park & Associates, PLC

(57) ABSTRACT

A stretchable film includes a first region including a plurality of first patterns having a concave polygonal shape. The stretchable film also includes a second region including a plurality of second patterns having a concave polygonal shape. The stretchable film further includes a buffer region between the first region and the second region.

10 Claims, 9 Drawing Sheets

(51) Int. Cl.
*B32B 5/14* (2006.01)
*B32B 7/02* (2006.01)
*B32B 27/28* (2006.01)
*B32B 27/40* (2006.01)
*B32B 1/00* (2006.01)
*B32B 3/26* (2006.01)
*G03F 7/20* (2006.01)
*G09G 3/00* (2006.01)
*G02F 1/1333* (2006.01)

(52) U.S. Cl.
CPC ....... *B32B 2307/51* (2013.01); *B32B 2457/20* (2013.01); *B32B 2457/202* (2013.01); *B32B 2457/206* (2013.01); *G02F 1/133305* (2013.01); *H01L 2251/5338* (2013.01)

(56) References Cited

U.S. PATENT DOCUMENTS

| | | | |
|---|---|---|---|
| 2008/0157235 | A1 | 7/2008 | Rogers et al. |
| 2008/0203556 | A1* | 8/2008 | Huang ............... H01L 21/76898 257/698 |
| 2010/0143848 | A1* | 6/2010 | Jain ....................... B81C 1/0019 430/315 |
| 2010/0330338 | A1 | 12/2010 | Boyce et al. |
| 2011/0156314 | A1* | 6/2011 | Alberg ..................... B29C 41/26 264/334 |
| 2012/0147351 | A1* | 6/2012 | Jak ...................... G03F 7/70191 355/71 |
| 2013/0344601 | A1* | 12/2013 | Soman .................... A61L 27/14 435/396 |

FOREIGN PATENT DOCUMENTS

| | | |
|---|---|---|
| KR | 10-0528763 | 11/2005 |
| KR | 10-2011-0057620 | 6/2011 |
| WO | 2009/067507 | 5/2009 |

OTHER PUBLICATIONS

European Patent Office Search Report dated Dec. 16, 2015, in European Patent Application No. 15187608.3.

\* cited by examiner

STRETCHABLE FILMS, METHODS OF MANUFACTURING THE SAME AND DISPLAY DEVICES INCLUDING THE SAME

CROSS-REFERENCE TO RELATED APPLICATION

This application claims priority and benefit from Korean Patent Application No. 10-2014-0135628, filed on Oct. 8, 2014, which is incorporated by reference for all purposes as if fully set forth herein.

BACKGROUND

Example embodiments relate to stretchable films, methods of manufacturing the same and display devices including the same. More particularly, exemplary embodiments relate to stretchable films having auxeticity, methods of manufacturing the same and display devices including the same.

Recently, a flexible display device including, e.g., an organic light emitting display (OLED) device or a liquid crystal display (LCD) device which may have stretchable and/or extensible properties has been researched.

For example, elements or devices of the display device may be formed on a flexible resin substrate to achieve the flexible display device. However, when the display device is attached on a surface having a variable curvature, sufficient flexible and/or wearable characteristics may not be realized only through the use of the flexible resin substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a stretchable film having improved flexibility and adhesion.

Exemplary embodiments provide a method of manufacturing a stretchable film having improved flexibility and adhesion.

Exemplary embodiments provide a display device including a stretchable film having improved flexibility and adhesion.

Additional aspects will be set forth in the detailed description which follows, and, in part, will be apparent from the disclosure, or may be learned by practice of the inventive concept.

An exemplary embodiment discloses a stretchable film that includes a first region including a plurality of first patterns having a concave polygonal shape, a second region including a plurality of second patterns having a convex polygonal shape, and a buffer region between the first region and the second region.

An exemplary embodiment also discloses a stretchable film that includes a first region including a plurality of layers, the layers having an auxeticity and rigidities different from each other. The stretchable film also includes a second region including the plurality of the layers, the layers in the second region being disposed in a different order from the layers disposed in the first region.

An exemplary embodiment further discloses a display device that includes a flexible base substrate, a pixel circuit and a light emitting structure sequentially disposed on the flexible base substrate, and a stretchable film attached on a bottom of the flexible base substrate, the stretchable film including a first region and a second region, which are divided according to curvatures of an object, and the stretchable film including at least one of different patterns and different disposed structures in each of the first region and the second region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
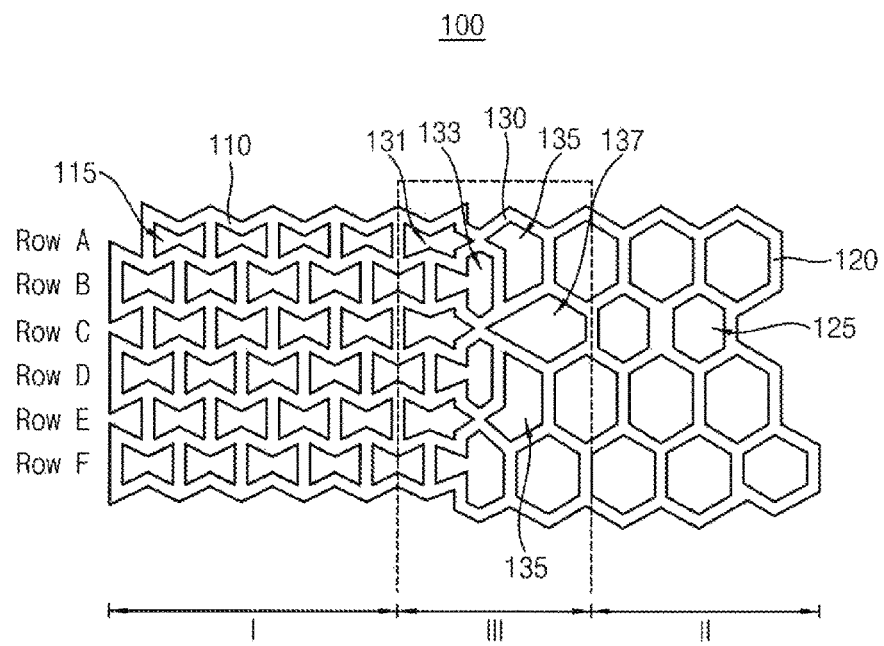
FIG. 1 is a top plan view illustrating a stretchable film in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a top plan view illustrating a stretchable film in accordance with an exemplary embodiment.

Referring to FIG. 1, a stretchable film 100 may have an auxeticity, and may include a silicone-based resin material. The silicone-based resin material may include a photo-patternable silicone (PPS).

As used herein, the term "auxeticity" may refer to a property that expands or contracts in a vertical or horizontal direction relative to an external force. For example, when a tensional force is applied horizontally to a portion of the stretchable film 100, the portion may expand vertically (or longitudinally). When a contractional force is applied vertically to a portion of the stretchable film 100, the portion may contract horizontally.

In exemplary embodiments, the stretchable film 100 may be divided into a first region I and a second region II. In some embodiments, the stretchable film 100 may further include a buffer region III between the first region I and the second region II. The first and second regions I and II may be connected to each other by the buffer region III.

In exemplary embodiments, the stretchable film 100 may include a plurality of openings and boundary patterns. The openings may be separated from each other by the boundary patterns. Accordingly, the stretchable film 100 may have a net shape or a mesh shape due to the openings and the boundary patterns.

The openings may include a first opening 115 and a second opening 125. A plurality of the first openings 115 may be formed in the first region I and a plurality of the second openings 125 may be formed in the second region II. In some embodiments, buffer openings 131, 133, 135, and 137 may be included in the buffer region III.

The openings may be separated from each other by the boundary patterns. A first boundary pattern 110, a second boundary pattern 120, and a buffer boundary pattern 130 may be formed in the first region I, the second region II, and the buffer region III, respectively. In exemplary embodiments, the boundary pattern may include a resin material having the auxeticity.

For example, the boundary pattern may include polydimethylsiloxane (PDMS) or polyurethane (PU). In some embodiments, the boundary pattern may include PPS.

In exemplary embodiments, the stretchable film 100 may be attached to an object that may include surfaces having different curvatures. For example, the object may include a surface having a positive Gaussian curvature (hereinafter, "a positive Gaussian surface") and a surface having a negative Gaussian curvature (hereinafter, "a negative Gaussian surface"). The object may further include an inflection region between the positive Gaussian surface and the negative Gaussian surface.

In some embodiments, the first region I, the second region II, and the buffer region III of the stretchable film 100 may be attached to the positive Gaussian surface, the negative Gaussian surface, and the inflection region of the object, respectively.

In exemplary embodiments, the first opening 115 included in the first region I may have a concave polygonal shape. In some embodiments, the first opening 115 may have a substantially ribbon shape as illustrated in FIG. 1.

In this case, a plurality of the first openings 115 having the ribbon shape may be arranged to define a first opening row A. A plurality of the first opening rows A, B, C, D, E, and F may be arranged in a vertical direction. The first openings 115 in the neighboring first opening rows (e.g., first openings in first opening rows A and B) may be adjacent to each other in a staggered arrangement so that a density of the first openings 115 in the first region I may be improved.

In exemplary embodiments, the second opening 125 included in the second region II may have a convex polygonal shape. In some embodiments, the second opening 125 may have a substantially hexagonal shape as illustrated in FIG. 1. Accordingly, the second region II may have a mesh structure of a substantially honeycomb shape.

The buffer region III may be interposed between the first and second regions I and II to assist a structural change from the first opening 115 to the second opening 125. For example, the buffer region III may include the buffer openings so that the ribbon-shape opening may be converted gradually into the hexagonal opening.

For example, the buffer opening may include different types of openings having different shapes. As illustrated in FIG. 1, the buffer opening may include first, second, third, and fourth buffer openings 131, 133, 135, and 137 sequentially arranged along a horizontal direction from the first region I to the second region II.

However, the shapes or structures of the buffer openings may not be limited to those illustrated in FIG. 1, and may be suitably modified so that a structural transfer from the first opening 115 to the second opening 125 may occur.

Although FIG. 1 illustrates the stretchable film 100 with one first region I and the second region II, exemplary embodiments may include the stretchable film 100 having a plurality of the first and second regions I and II according to the curvatures of the object. The buffer region III may be included at each region between the first and second regions I and II.

Figure 2:
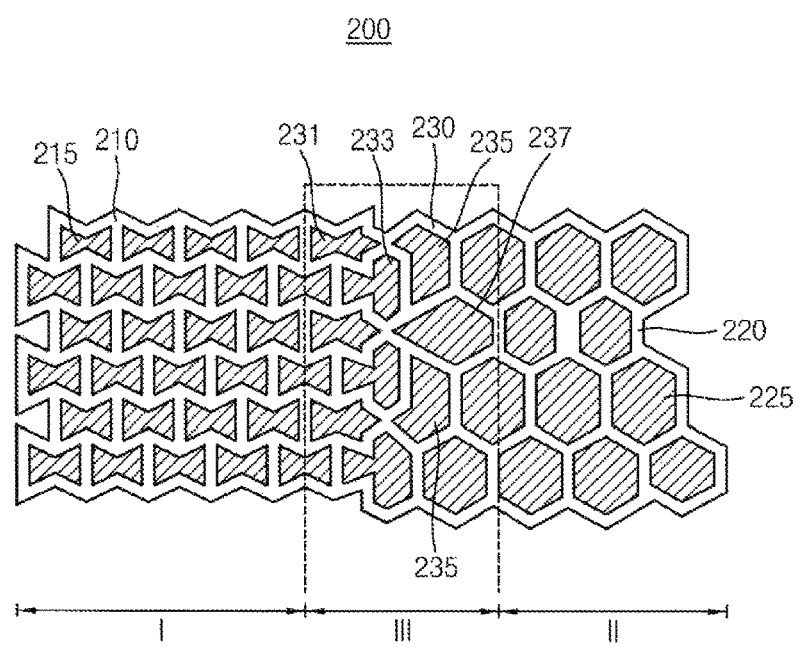
FIG. 2 is a top plan view illustrating a stretchable film in accordance with an exemplary embodiment.

FIG. 2 is a top plan view illustrating a stretchable film in accordance with an exemplary embodiment.

A stretchable film 200 of FIG. 2 may have constructions substantially the same as or similar to those of the stretchable film 100 illustrated in FIG. 1 except that stretchable patterns are formed instead of the openings of FIG. 1.

In exemplary embodiments, a first boundary pattern 210 may be included in a first region I of the stretchable film 200, and a plurality of first stretchable patterns 215 may be separated from each other by the first boundary pattern 210. The first stretchable pattern 215 may have a concave polygonal shape (e.g., a ribbon shape).

A second boundary pattern 220 may be included in a second region II of the stretchable film 200, and a plurality of second stretchable patterns 225 may be separated from each other by the second boundary pattern 220. The second stretchable pattern 225 may have a convex polygonal shape (e.g., a hexagonal shape).

A buffer boundary pattern 230 may be included in a buffer region III of the stretchable film 200, and a plurality of buffer stretchable patterns may be separated from each other by the buffer boundary pattern 230. For example, the buffer stretchable patterns may include first, second, third, and fourth buffer stretchable patterns 231, 233, 235, and 237 having different shapes from one another along a horizontal direction from the first region I to the second region II.

In exemplary embodiments, the boundary patterns 210, 220, and 230 may include a material having a rigidity greater than those of the stretchable patterns 215, 225, 231, 233, 235, and 237. For example, the boundary patterns 210, 220, and 230 may include a resin material having an elastic modulus (e.g., Young's modulus) greater than a elastic modulus of the stretchable patterns 215, 225, 231, 233, 235, and 237.

In some embodiments, the stretchable patterns 215, 225, 231, 233, 235, and 237 may include PDMS and/or PPS, and the boundary patterns 210, 220, and 230 may include PU.

When the stretchable film 200 is attached to the object, the stretchable patterns 215, 225, 231, 233, 235, and 237 may be expanded or stretched. The boundary patterns 210, 220, and 230 may include a resin material having the relatively high rigidity or modulus so that the stretchable patterns 215, 225, 231, 233, 235, and 237 may be prevented from being excessively transformed or losing intrinsic elasticity.

Figure 3:
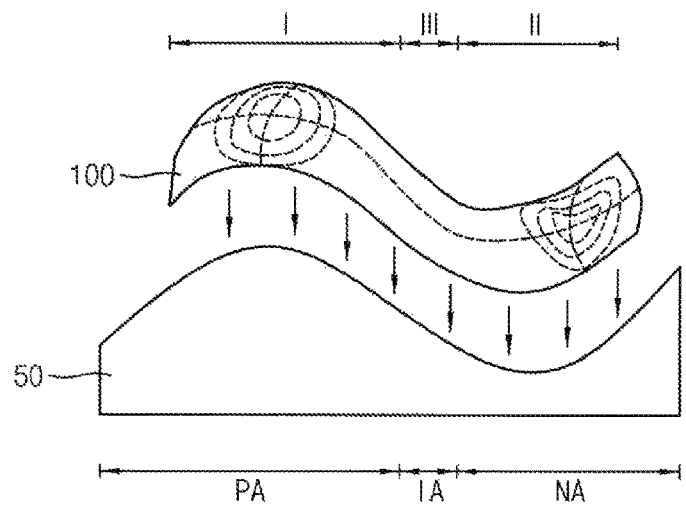
FIG. 3 is a schematic view illustrating an adhesion between a stretchable film and an object in accordance with an exemplary embodiment.

FIG. 3 is a schematic view illustrating an adhesion between a stretchable film and an object in accordance with an exemplary embodiment.

Referring to FIG. 3, a stretchable film may be attached on an object 50 including a plurality of curved surfaces. For example, the stretchable film of FIG. 1 or FIG. 2 may be attached on the object 50.

For convenience of descriptions, the stretchable film is denoted by a reference numeral "100", and detailed illustrations of the boundary patterns, the openings, and the stretchable patterns included in the stretchable film 100 are omitted in FIG. 3. Dotted lines indicated in the stretchable film 100 are virtual lines to represent expanding or stretching directions of the stretchable film 100.

The object 50 may include a positive Gaussian surface area PA, an inflection area IA, and a negative Gaussian surface area NA.

In exemplary embodiments, a first region I, a second region II, and a buffer region III of the stretchable film 100 may be attached on the positive Gaussian surface area PA, the negative Gaussian surface area NA, and the inflection area IA of the object 50, respectively.

As illustrated with reference to FIGS. 1 and 2, the first region I of the stretchable film 100 may include the opening or the stretchable pattern having the concave polygonal shape (e.g., the ribbon shape). Accordingly, the first region I of the stretchable film 100 may be transformed as a substantially dome shape to be adhered to the object 50.

The second region II of the stretchable film 100 may include the opening or the stretchable pattern having the concave polygonal shape (e.g., the hexagonal shape). Accordingly, the second region II of the stretchable film 100 may be transformed as a substantially saddle shape to be adhered to the object 50.

The buffer region III of the stretchable film 100 may include the buffer opening or the buffer stretchable pattern so that a drastic transformation of the stretchable film 100 may be avoided between the first region I and the second region II. Thus, a looseness of the stretchable film 100 may be prevented at, e.g., the inflection area IA of the object 50.

As illustrated with reference to FIGS. 1 to 3, the stretchable film in accordance with exemplary embodiments may include different types of the openings or the stretchable patterns which may be optimally designed for curvatures and structures of an object. Thus, when the stretchable film is attached to the object, the stretchable film may be optimally expanded or stretched according to curved surfaces of the object. Therefore, the stretchable film may be adhered to the object without any looseness or lifting-off from the object.

Additionally, polygonal parameters of the opening or the stretchable pattern included in the stretchable film, such as an internal angle, an external angle, or a length of a side, may be optimally modified so that an adherence of the stretchable film may be further enhanced.

Figure 4:
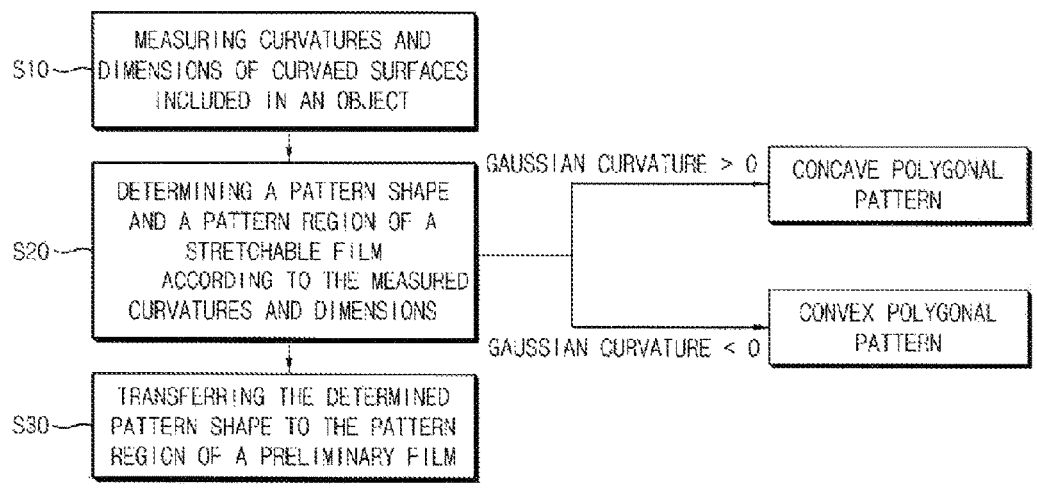
FIG. 4 is a flow chart illustrating a method of manufacturing a stretchable film in accordance with an exemplary embodiment.
Figure 5:
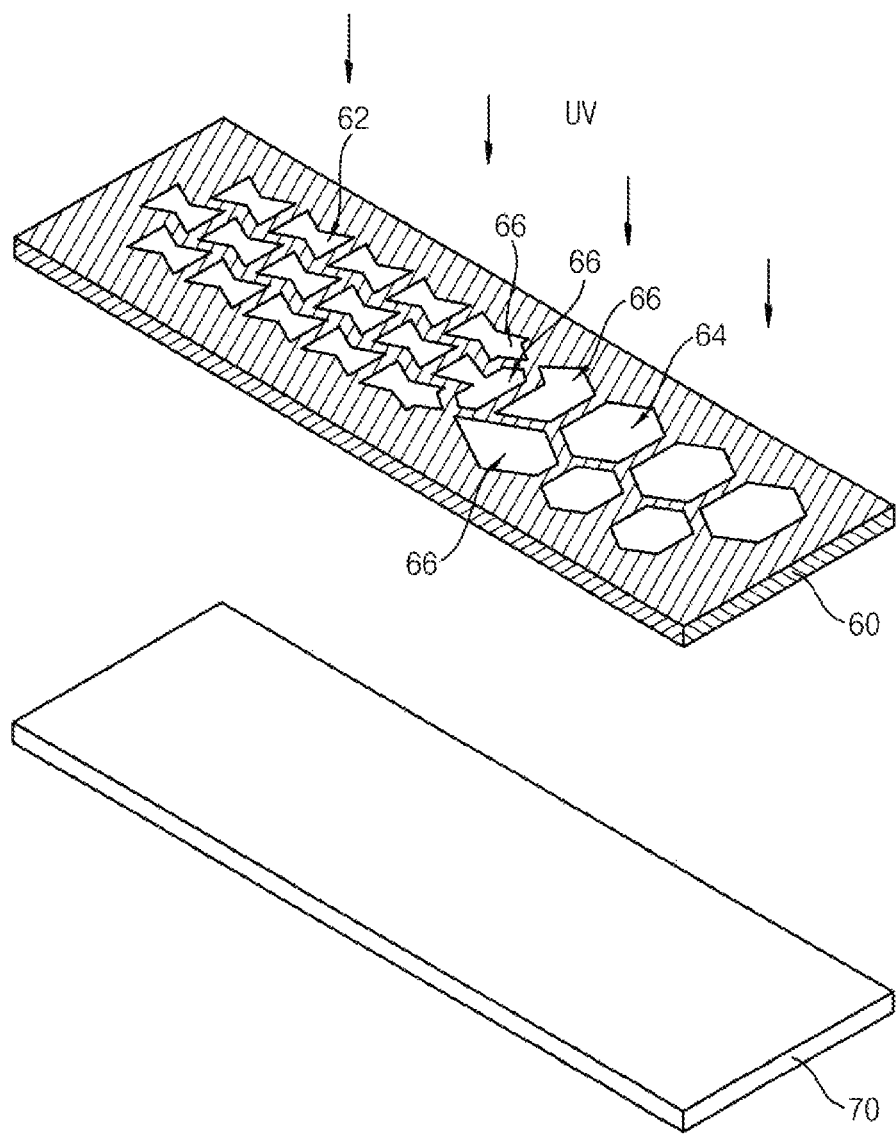
FIG. 5 is a schematic view illustrating an image transfer process on a preliminary film in accordance with an exemplary embodiment.

FIG. 4 is a flow chart illustrating a method of manufacturing a stretchable film in accordance with an exemplary embodiment. FIG. 5 is a schematic view illustrating an image transfer process on a preliminary film in accordance with an exemplary embodiment.

Referring to FIG. 4, in operation S10, curvatures of an object may be measured.

In exemplary embodiments, the object may include a plurality of curved surfaces having different curvatures. For example, the object may include a positive Gaussian surface and a negative Gaussian surface as illustrated in FIG. 3.

A dimension of each of the curved surfaces corresponding to the measured curvature may be also measured in operation S10. Accordingly, data of the curvature and the dimension of each curved surface of the object may be stored.

In operation S20, a pattern shape that may be formed in a stretchable film may be determined according to the curvature of the object. A pattern of the stretchable film may include an opening illustrated in FIG. 1 or a stretchable pattern illustrated in FIG. 2.

In some embodiments, if one area of the object has a positive Gaussian curvature, a pattern shape of the stretchable film corresponding to the area may be determined as a concave polygonal pattern. For example, the concave polygonal pattern may include a ribbon-shape pattern.

In some embodiments, if one area of the object has a negative Gaussian curvature, a pattern shape of the stretchable film corresponding to the area may be determined as a convex polygonal pattern. For example, the convex polygonal pattern may include a hexagonal pattern.

A pattern region for the pattern shape of the stretchable film may be also determined in operation S20 according to the data on the dimension of the curved surface of the object measured in operation S10. For example, as illustrated in FIGS. 1 and 2, dimensions of a first region I for the concave polygonal pattern and a second region II of the convex polygonal pattern may be determined with respect to the stretchable film.

In some embodiments, a dimension of a buffer region III between the first and second regions I and II may be also determined.

Referring to FIGS. 4 and 5, in operation S30, the determined pattern shapes may be transferred to the pattern regions of a preliminary film 70 to obtain the stretchable film.

In some embodiments, the transfer process may include a photo process. In this case, the preliminary film may include a PPS film.

For example, a mask 60 including slits corresponding to the determined pattern shapes may be prepared. The slits may have dimensions and shapes corresponding to the concave polygonal pattern and the convex polygonal pattern. Accordingly, the mask 60 may include a concave polygonal slit 62 and a convex polygonal slit 64 substantially overlapping the first region I and the second region II of the stretchable film.

In some embodiments, buffer slits 66 having shapes substantially the same as or similar to those of the buffer openings illustrated in FIG. 1 may be formed between the concave polygonal slit 62 and the convex polygonal slit 64.

The mask 60 may be disposed over the preliminary film 70, and an exposure process may be performed on the preliminary film 70 through the mask 60. The exposure process may include an ultraviolet irradiation.

Thus, exposed portions of the preliminary film 70 through the slits 62, 64, and 66 may be removed to obtain the stretchable film (e.g., as illustrated in FIG. 1).

The portions of the preliminary film 70 removed by the exposure process through the slits 62, 64, and 66 may be converted into the openings illustrated in FIG. 1. For example, ribbon-shape openings may be formed at the pattern region determined as the first region I. Hexagonal openings may be formed at the pattern region determined as the second region II.

In some embodiments, buffer openings may be formed at the pattern region allotted as the buffer region III.

In some embodiments, the transfer process of operation S30 may be performed through a molding process. For example, a mold may be prepared according to the pattern shape and the pattern region determined through operations S10 and S20. The mold may include slits substantially the same as or similar to those of the boundary patterns illustrated in FIG. 1.

A resin material such as PDMS or PU may be provided onto the mold so that the slits may be filled with the resin material. After a curing process, a cured resin material may be detached from the mold to manufacture the stretchable film of FIG. 1.

Figure 6:
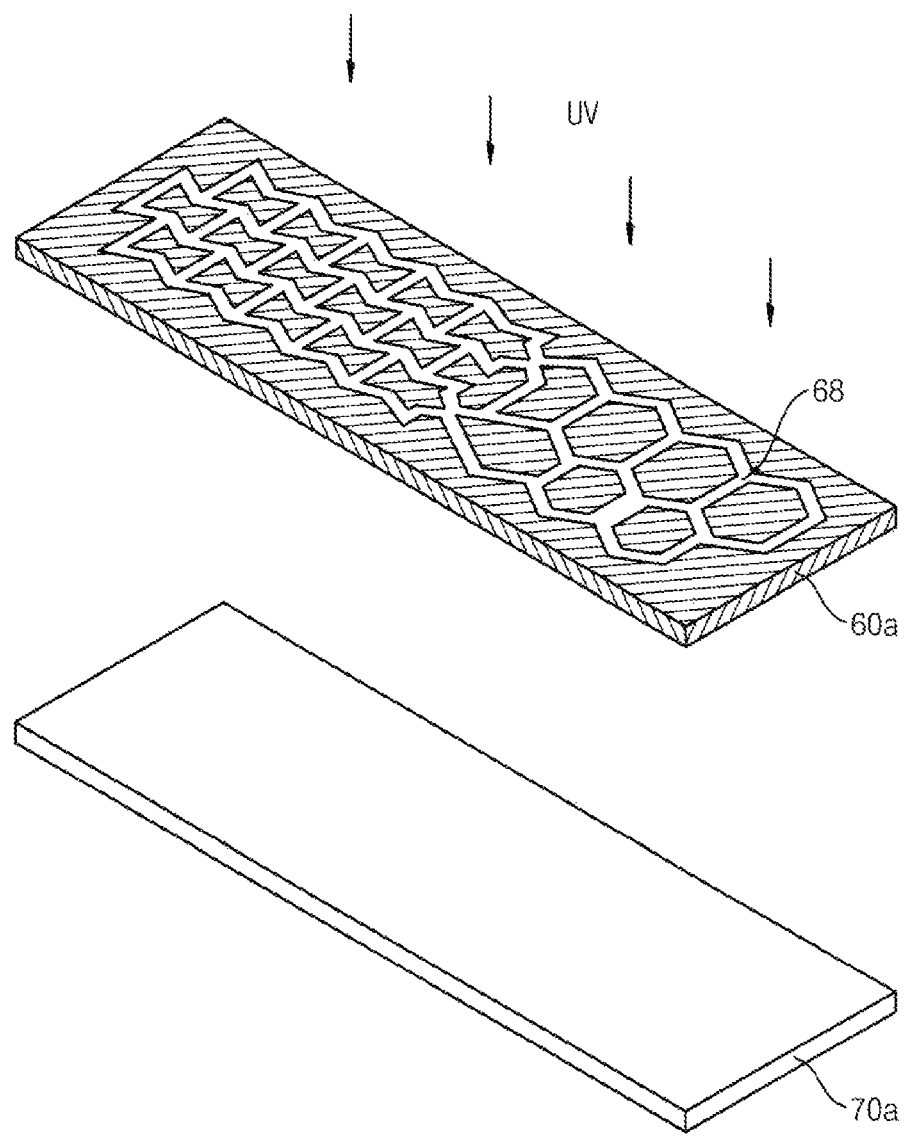
FIGS. 6 and 7 are schematic views illustrating image transfer processes on a preliminary film in accordance with an exemplary embodiment.
Figure 7:
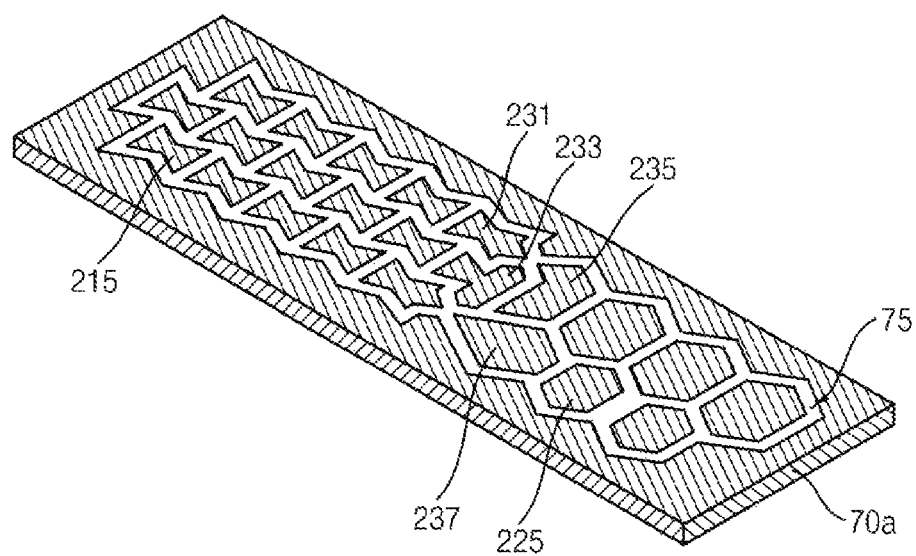

FIGS. 6 and 7 are schematic views illustrating image transfer processes on a preliminary film in accordance with an exemplary embodiment.

Referring to FIG. 6, a mask 60a for a pattern transfer process may include a boundary slit 68. The boundary slit 68 may have a shape substantially the same as or similar to those of the boundary patterns 210, 220, and 230 illustrated in FIG. 2.

The mask 60a may be disposed on a preliminary film 70a, and an exposure process (e.g., a UV irradiation) may be performed on the preliminary film 70a through the boundary slit 68.

Referring to FIG. 7, portions of the preliminary film 70a exposed through the boundary slit 68 (shown in FIG. 6) may be removed to form a boundary gap 75. Portions of the preliminary film 70a surrounded by the boundary gap 75 may be defined as the first stretchable pattern 215, the second stretchable pattern 225, and the buffer stretchable patterns 231, 233, 235, and 237 as illustrated in FIG. 2.

A resin material having relatively high rigidity or modulus such as PU may be filled in the boundary gap 75. Then a curing process may be performed to form a boundary pattern. The boundary pattern may include the first boundary pattern 210, the second boundary pattern 220 and the buffer boundary pattern 230 as illustrated in FIG. 2.

According to exemplary embodiments as described above, a curvature of an object may be measured, a pattern shape may be determined according to the measured curvature. The pattern shape may be transferred on a desired region of a stretchable film. Therefore, the stretchable film that may be optimally adhered on a surface of the object may be achieved.

Figure 8:
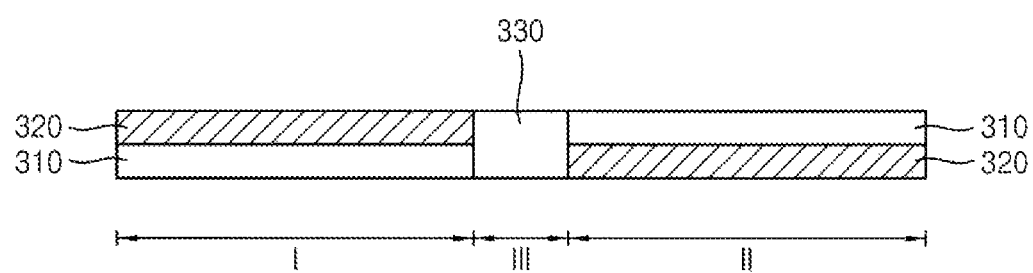
FIG. 8 is a cross-sectional view illustrating a stretchable film in accordance with an exemplary embodiment.

FIG. 8 is a cross-sectional view illustrating a stretchable film in accordance with an exemplary embodiment.

Referring to FIG. 8, a stretchable film 300 may include a first region I and a second region II divided along a horizontal direction. In some embodiments, the stretchable film 300 may further include a buffer region III inserted between the first and second regions I and II.

The first and second regions I and II may have a multi-layered structure. For example, the first and second regions I and II may have a double-layered structure including layers of different rigidities.

The first region I of the stretchable film 300 may include a high rigidity layer 310 and a low rigidity layer 320 stacked on the high rigidity layer 310. The high rigidity layer 310 may include a resin material having an elastic modulus greater than that of the low rigidity layer 320. For example, the high rigidity layer 310 and the low rigidity layer 320 may include PU and PDMS, respectively.

The second region II of the stretchable film 300 may have a reverse arrangement of the first region I. For example, the second region II may include the low rigidity layer 320 and the high rigidity layer 310 stacked on the low rigidity layer 320.

A buffer pattern 330 may be disposed at the buffer region III of the stretchable film 300. In exemplary embodiments, the buffer pattern 330 may include a resin material having a modulus between the high rigidity layer 310 and the low rigidity layer 320. The buffer pattern 330 may serve as an adhesion member between the first region I and the second region II.

In exemplary embodiments, a low rigidity material layer including, e.g., PDMS, may be formed on a high rigidity material layer including, e.g., PU, to obtain a preliminary film. The preliminary layer may be cut to be divided into a first portion and a second portion. The second portion may be flipped, and the first and second portions may be attached through the buffer pattern 330 such that the different rigidity material layers may face each other in a horizontal direction. Accordingly, the stretchable film 300 of FIG. 8 may be manufactured.

In some exemplary embodiments, the stretchable film 300 may be obtained by a molding process. For example, a high rigidity resin and a low rigidity resin may be sequentially injected in a mold comparable to the first region I and then cured. The low rigidity resin and the high rigidity resin may be sequentially injected in a mold comparable to the second region II and then cured. Subsequently, a resin material may be injected in a mold comparable to the buffer region III to form the buffer pattern 330. Accordingly, the stretchable film 300 of FIG. 8 may be achieved.

Figure 9:
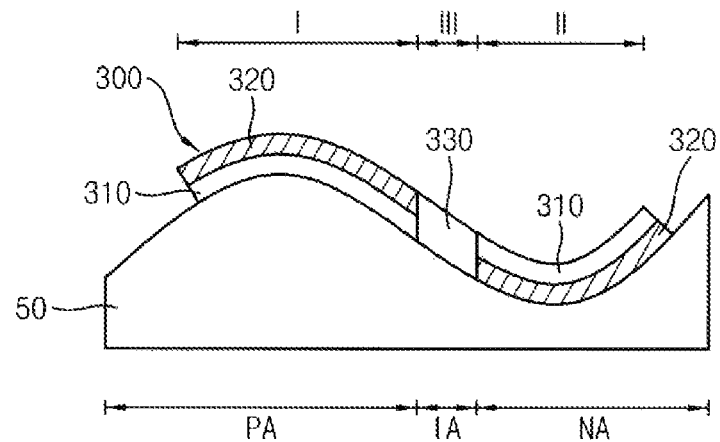
FIG. 9 is a schematic view illustrating an adhesion between a stretchable film and an object in accordance with an exemplary embodiment.

FIG. 9 is a schematic view illustrating an adhesion between a stretchable film and an object in accordance with an exemplary embodiment.

Referring to FIG. 9, and as also illustrated in FIG. 3, an object 50 may include a positive Gaussian surface area PA and a negative Gaussian surface area NA. An area between the positive Gaussian surface area PA and the negative Gaussian surface area NA may be defined as an inflection area IA.

The first region I, the second region II, and the buffer region III of the stretchable film 300 may be attached on the positive Gaussian surface area PA, the negative Gaussian surface area NA, and the inflection area IA of the object 50, respectively.

The low rigidity layer 320 may be stretched more greatly relative to the high rigidity layer 310. Accordingly, an orientation of curvatures of the object 50 may be transferred or delivered in the stretchable film 300 so that the stretchable film 300 may be adhered to the object 50 without any looseness or lifting-off from curved surfaces of the object 50.

Further, the buffer pattern 330 may prevent or absorb a distortion of the stretchable film 300 that may be caused by a conversion of the curvature at the inflection area IA. Thus, a separation or a detachment between the high rigidity layer 310 and the low rigidity layer 320 at the inflection area IA or the buffer region III may be prevented.

Figure 10:
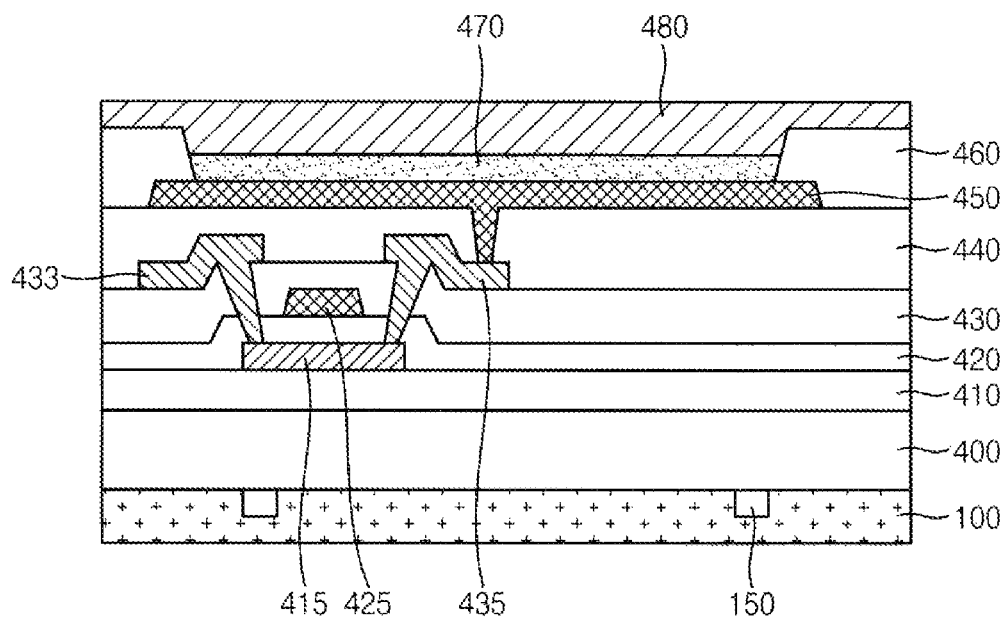
FIG. 10 is a cross-sectional view illustrating a display device in accordance with an exemplary embodiment.

FIG. 10 is a cross-sectional view illustrating a display device in accordance with an exemplary embodiment. For example, FIG. 10 illustrates an organic light emitting display (OLED) device.

A method of forming elements of the display device is also described with reference to FIG. 10.

Referring to FIG. 10, the display device may include a stretchable film 100 attached to a bottom surface of a base substrate 400, and a pixel circuit and a light emitting structure disposed on the base substrate 400.

The base substrate 400 may include a polymer material having a flexible property. For example, the base substrate 400 may include a polyimide-based material. Thus, the display device may be provided as a flexible OLED device.

A barrier layer 410 may be formed on the base substrate 400. An impurity diffusion between the base substrate 400 and structures formed thereon may be blocked by the barrier layer 410.

The barrier layer 410 may be formed of, e.g., silicon oxide or silicon nitride. In some embodiments, the barrier layer 410 may have a multi-stacked structure including a silicon oxide layer and a silicon nitride layer. The barrier layer 410 may cover an entire top surface of a substantial portion of the base substrate 400.

In some embodiments, a buffer layer may be further formed on the barrier layer 410 using silicon oxide, silicon nitride, and/or silicon oxynitride.

An active layer 415 may be formed on the barrier layer 410. For example, a semiconductor material layer may be formed on the barrier layer 410, and patterned by a photo-lithography process to form the active layer 415.

The semiconductor material layer may be formed using amorphous silicon or polysilicon. For example, an amorphous silicon layer may be formed on the barrier layer 410, and then a crystallization process such as a low temperature polycrystalline silicon (LTPS) process or a laser annealing process to form the semiconductor material layer including polysilicon.

Alternatively, the semiconductor material layer may be formed of a semiconductor oxide such as indium gallium zinc oxide (IGZO), zinc tin oxide (ZTO), or indium tin zinc oxide (ITZO).

A gate insulation layer 420 may be formed on the buffer layer 410 to cover the active layer 415. For example, the gate insulation layer 420 may be formed of silicon oxide, silicon nitride, or silicon oxynitride by a CVD process, a spin coating process, or the like.

The gate electrode 425 may be formed on the gate insulation layer 420. The gate electrode 425 may be substantially superimposed over the active layer 415. For example, a first conductive layer may be formed on the gate insulation layer 420, and then patterned to form the gate electrode 425 overlapping the active layer 415.

The first conductive layer may be formed using a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), etc., an alloy of the listed metals, or a nitride of the listed metals. These may be used alone or in a combination thereof. Alternatively, the first conductive layer may be formed of a transparent conductive material such as indium tin oxide (ITO), indium zinc oxide (IZO) or aluminum doped zinc Oxide (AZO).

In some embodiments, impurities may be implanted to the active layer 415 using the gate electrode 425 as an implantation mask, such that a source region and a drain region may be formed at both ends of the active layer 415. A portion of the active layer 415 between the source region and the drain region may serve as a channel region substantially overlapping the gate electrode 425.

An insulating interlayer 430 may be formed on the gate insulation layer 420 to cover the gate electrode 425. The insulating interlayer 430 may be formed of silicon oxide, silicon nitride, or silicon oxynitride. In some embodiments, the insulating interlayer 430 may be formed as a multi-layered structure including a silicon oxide layer and a silicon nitride layer.

A source electrode 433 and a drain electrode 435 may be formed through the insulating interlayer 430 and a gate insulation layer 420. The source electrode 433 and the drain electrode 435 may be in contact with the active layer 415.

For example, the insulating interlayer 430 and the gate insulation layer 420 may be partially etched to form contact holes through which the active layer 415 is exposed. A second conductive layer filling the contact holes may be formed on the insulating interlayer 430, and patterned to form the source electrode 433 and the drain electrode 435. The source electrode 433 and the drain electrode 435 may be in contact with the source region and the drain region of the active layer 415, respectively.

The second conductive layer may be formed using a process and a material substantially the same as or similar to those for the first conductive layer.

Accordingly, a thin film transistor (TFT) including the active layer 415, the gate insulation layer 420, the gate electrode 425, the source electrode 433, and the drain electrode 435 may be formed. For example, at least one TFT may be formed on each pixel of the display device. In some embodiments, a switching TFT and a driving TFT may be formed on the each pixel of the display device. Further, a capacitor may be also formed on the each pixel of the display device.

In some embodiments, the display device may include a data line and a scan line. The scan line may be patterned from the first conductive layer to be connected to the gate electrode 415. The data line may be patterned from the second conductive layer to be connected to the source electrode 433.

Accordingly, the pixel circuit including the data line, the scan line, and the TFT may be formed on the base substrate 400.

A via insulation layer 440 covering the source electrode 433 and the drain electrode 435 may be formed on the insulating interlayer 430.

In exemplary embodiments, the via insulation layer 440 may be formed using an organic material, such as a polyimide, an epoxy-based resin, an acryl-based resin, or polyester. The via insulation 440 may have a sufficiently large thickness such that a top surface of the via insulation layer 440 may be substantially leveled or planar.

The above mentioned barrier layer 410, the semiconductor material layer, the first and second conductive layers, the gate insulation layer 420, the insulating interlayer 430, and the via insulation layer 440 may be formed by at least one of a chemical vapor deposition (CVD) process, a plasma enhanced chemical vapor deposition (PECVD) process, a high density plasma-chemical vapor deposition (HDP-CVD) process, a thermal deposition process, a vacuum evaporation process, a spin coating process, a sputtering process, an atomic Layer deposition (ALD) process, and a printing process.

The light emitting structure including a first electrode 450, an emitting layer 470, and a second electrode 480 may be formed on the via insulation layer 440.

The first electrode 450 may be formed on the via insulation layer 440 and may be electrically connected to the drain electrode 435

For example, the via insulation layer 440 may be partially etched to form a via hole through which the drain electrode 435 may be exposed. A third conductive layer filling the via hole may be formed on the via insulation layer 440 and patterned to form the first electrode 450.

In exemplary embodiments, the third conductive layer may be formed using a metal such as Al, Ag, W, Cu, Ni, Cr, Mo, Ti, Pt, Ta, Nd, or Sc, or an alloy of the listed metals, by a thermal deposition process, a vacuum evaporation process, a sputtering process, an ALD process, a CVD process, or a printing process. In some embodiments, the third conductive layer may be formed of a transparent conductive material, such as ITO, IZO, zinc oxide, or indium oxide.

The first electrode 450 may serve as a pixel electrode or an anode of the display device. The first electrode 450 may be individually provided for each pixel.

A pixel defining layer (PDL) 460 may be formed on the via insulation layer 440. The PDL 460 may cover a peripheral portion of the first electrode 450. For example, a photosensitive organic material such as a polyimide resin or an acryl resin may be coated, exposed, and developed to form the PDL 460.

The emitting layer 470 may be formed on the first electrode exposed by the PDL 460. The second electrode 480 may be formed on the emitting layer 470 and the PDL 460.

A predetermined voltage may be applied to the first and second electrodes 450 and 480 generating holes and electrons. The holes and electrons may combine with each other to generate excitons. The excitons may be transferred to a ground state so that a light may be emitted.

In exemplary embodiments, a hole transport layer (HTL) may be further formed between the emitting layer 470 and the first electrode 450. An electron transport layer (ETL) may be further formed between the emitting layer 470 and the second electrode 480.

The emitting layer 470 may include light emitting materials for generating different colors of light (e.g., red, green, or blue). The emitting layer 470 may have a multi-layered structure for generating a white color of light.

The HTL may include a hole transport material, such as, 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, such as, tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

The emitting layer 470 may be formed by a spin coating process, a roll printing process, a nozzle printing process, an inkjet printing process, a transfer process using a donor substrate, etc. In some embodiments, the emitting layer 470 may be patterned to be confined by sidewalls of the PDL 460.

The second electrode 480 may be formed of a metal such as Li, Ca, LiF/Ca, LiF/Al, Al, Mg, Ag, Cr, W, Mo, or Ti, or an alloy thereof. Alternatively, the second electrode 480 may be formed of a transparent conductive material such as ITO, IZO, AZO, zinc oxide, or tin oxide. The second electrode 480 may be formed by a sputtering process, an ALD process, PVD process, a PLD process, or a printing process.

The second electrode 480 may extend on a plurality of pixels and may serve as a common electrode of the display device.

In some embodiments, an encapsulation layer including a flexible polymer material may be formed on the second electrode 480.

A stretchable film 100 according to exemplary embodiments may be attached on a bottom of the base substrate 400. As illustrated in FIG. 1, the stretchable film 100 may include different types of openings designed according to regions to which the display device is attached.

In some embodiments, the display device may include the stretchable film of FIG. 2. In this case, the stretchable film 200 may include different types of stretchable patterns designed according to the regions to which the display device is attached.

In some embodiments, the display device may include the stretchable film 300 of FIG. 8. In this case, the stretchable film 300 may include a high rigidity layer and a low rigidity layer which may be stacked in different orders according to the regions to which the display device is attached.

In some embodiments, the display device may further include a calibration sensor 150. The calibration sensor 150 may be embedded in the stretchable film 100, or may be disposed at a region adjacent to an interface of the base substrate 400 and the stretchable film 100.

The calibration sensor 150 may recognize an image distortion when the stretchable film 100 is attached to an object and stretched or expanded. The distorted image may be amended into a planar image by the calibration sensor 150.

In some embodiments, the calibration sensor 150 may be provided for each region of the stretchable film 100. For example, the calibration sensor 150 may be provided for each of the first region I and the second region II corresponding to a positive Gaussian surface and a negative Gaussian surface of the object, respectively. Thus, the image distortions of different orientations may be amended by a plurality of the calibration sensors 150.

The calibration sensor 150 may include a Flex sensor, an acceleration sensor, or a gyro sensor.

As described above, the display device may include the stretchable film 100 that may be optimally designed according to a curvature variation of the object. The stretchable film 100 may be attached on the bottom of the base substrate 400 having a flexible property. Thus, a wearable display device without an image distortion and free from a lift-off from the object may be achieved.

FIGS. 11 to 14 are cross-sectional views illustrating a method of manufacturing a display device in accordance with exemplary embodiments. For example, FIGS. 11 to 14 illustrate a method of manufacturing the display device of FIG. 10.

Detailed descriptions on processes and materials substantially the same as or similar to those illustrated with reference to FIG. 10 are omitted for brevity.

Figure 11:
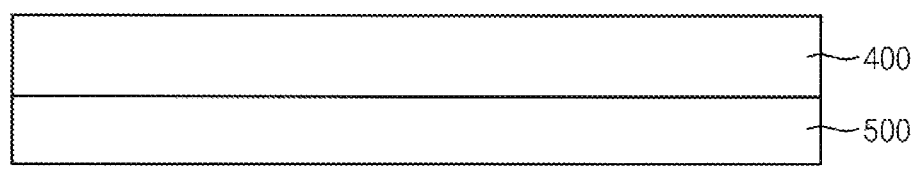
FIGS. 11, 12, 13, and 14 are cross-sectional views illustrating a method of manufacturing a display device in accordance with an exemplary embodiment.

Referring to FIG. 11, a base substrate 400 may be formed on a carrier substrate 500.

The base substrate 400 may be supported on the carrier substrate 500 while performing a device process on the base substrate 400. A glass substrate or a metal substrate may be used as the carrier substrate 500.

In exemplary embodiments, a composition including a polyimide precursor may be coated on the carrier substrate 500 to form a coating layer. Then the coating layer may be thermally cured. The polyimide precursor included in the coating layer may be polymerized during the curing process to form the base substrate 400 including a polyimide resin.

Figure 12:
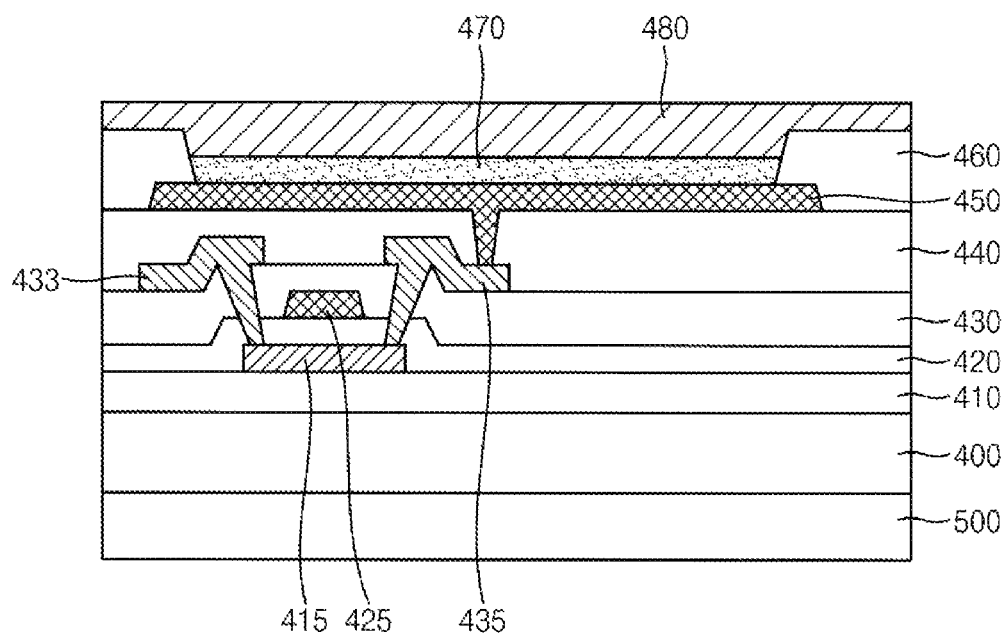

Referring to FIG. 12, and as also described with reference to FIG. 10, a pixel circuit and a light emitting structure including an emitting layer 470 may be formed on the base substrate 400.

Figure 13:
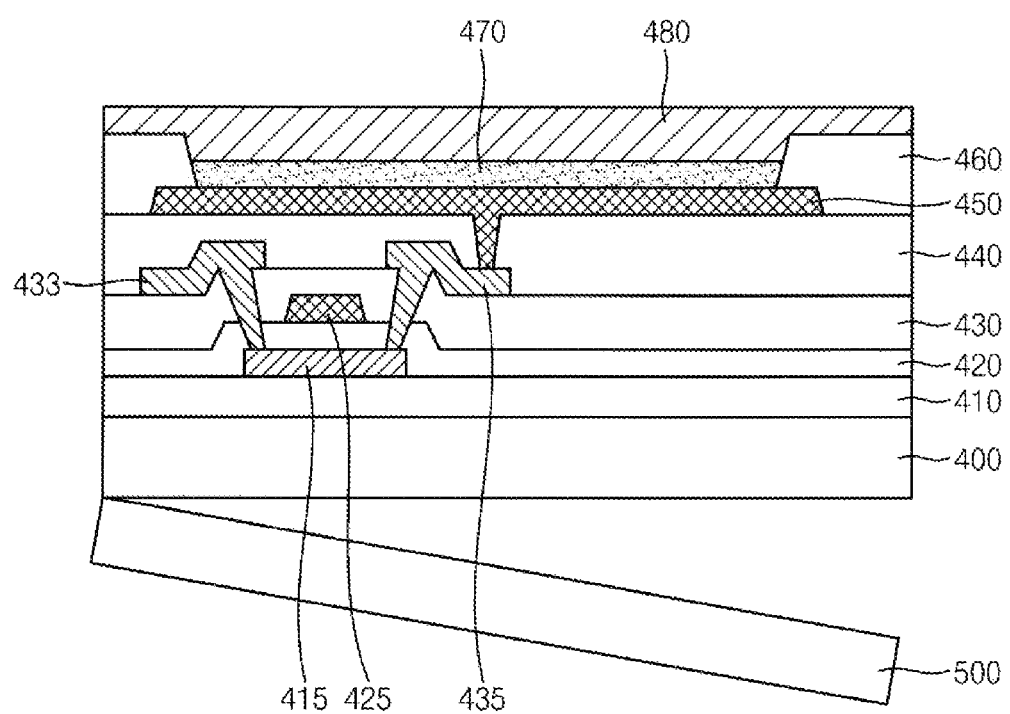

Referring to FIG. 13, the carrier substrate 500 may be separated or detached from the base substrate 400 such that a bottom surface of the base substrate 400 may be exposed.

For example, the carrier substrate 500 may be separated from the base substrate 400 by, e.g., a laser-lift process. Alternatively, the carrier substrate 500 may be pulled by a vacuum lifter or by manpower to be detached from the base substrate 400.

Figure 14:
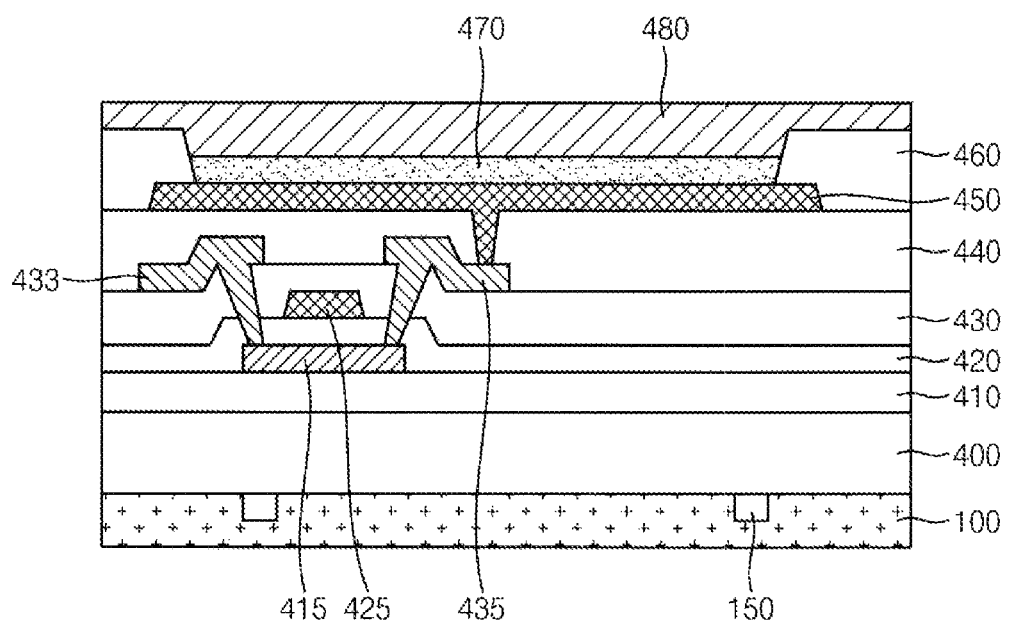

Referring to FIG. 14, a stretchable film 100 may be attached on the bottom surface of the base substrate 400 to obtain the display device in accordance with exemplary embodiments.

In exemplary embodiments, a calibration sensor 150 may be embedded in the stretchable film 100. Then the stretchable film 100 may be attached to the base substrate 400. In some embodiments, the calibration sensor 150 may be attached to the bottom surface of the base substrate 400, and then the stretchable film 100 may be attached to the substrate to cover the calibration sensor 150.

According to exemplary embodiments as described above, a stretchable film may include patterns or stacked structures having different shapes or materials according to a curvature construction of an object. Thus, the stretchable film may be optimally expanded or stretched according to a curvature change of the object. Therefore, the stretchable film may be adhered to a curved surface of the object without looseness or distortion. The stretchable film may be implemented to a flexible display device having a wearable property or any other flexible display.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:
1. A stretchable film, comprising:
a first region comprising a plurality of first stretchable patterns and a first boundary pattern that separates the plurality of first stretchable patterns from each other and surrounds the plurality of first stretchable pattern;
a second region comprising a plurality of second stretchable patterns and a second boundary pattern that sepa- rates the plurality of second stretchable patterns from each other and surrounds the plurality of second stretchable pattern; and a buffer region between the first region and the second region, wherein the plurality of first stretchable patterns comprise at least one of polydimethylsiloxane (PDMS) and photo-patternable silicon (PPS), wherein the plurality of second stretchable patterns comprise at least one of polydimethylsiloxane (PDMS) and photo-patternable silicon (PPS), and wherein the buffer region comprises first, second, third, and fourth buffer openings having different closed shapes from one another and that are sequentially arranged in a direction extending from the first region to the second region.

2. The stretchable film of claim 1, wherein the plurality of first stretchable patterns have a ribbon shape.

3. The stretchable film of claim 1, wherein the plurality of second stretchable patterns have a hexagonal shape.

4. The stretchable film of claim 1, wherein the second boundary pattern has a honeycomb mesh shape.

5. The stretchable film of claim 1, wherein the first and second boundary patterns have an elastic modulus greater than an elastic modulus of the plurality of first stretchable patterns and the plurality of second stretchable patterns.

6. The stretchable film of claim 5, wherein the buffer region comprises:

a plurality of buffer stretchable patterns configured to connect the plurality of first stretchable patterns and the plurality of second stretchable patterns.

7. The stretchable film of claim 6, wherein:

the plurality of stretchable buffer patterns comprise first, second, third, and fourth stretchable buffer patterns sequentially arranged in a direction from the first region and the second region and have different shapes from one another.

8. The stretchable film of claim 1, wherein the first region is attached on a positive Gaussian surface of an object, and the second region is attached on a negative Gaussian surface of the object.

9. The stretchable film of claim 8, wherein the buffer region is attached on an inflection surface of the object and the inflection surface is disposed between the positive Gaussian surface and the negative Gaussian surface.

10. A stretchable film, comprising:

a first region comprising a plurality of first patterns;

a second region comprising a plurality of second patterns; and a buffer region between the first region and the second region, the buffer region comprising first, second, third, and fourth buffer openings having different closed shapes from one another and that are sequentially arranged in a direction extending from the first region to the second region.

* * * * *